(12) United States Patent
Boyd

(10) Patent No.: US 6,215,227 B1
(45) Date of Patent: Apr. 10, 2001

(54) THICKNESS MODE PIEZOELECTRIC TRANSFORMER WITH END-MASSES

(75) Inventor: Clark Davis Boyd, Hampton, VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/559,004

(22) Filed: Apr. 21, 2000

Related U.S. Application Data

(60) Provisional application No. 60/165,864, filed on Nov. 16, 1999.

(51) Int. Cl.[7] .................. H01L 310/328; H01L 310/366; H01L 310/340; H01L 310/359

(52) U.S. Cl. .......................... 310/359; 310/328; 310/366; 310/340

(58) Field of Search ..................................... 310/340, 328, 310/325, 359, 366

(56) References Cited

U.S. PATENT DOCUMENTS

| 4,193,009 | | 3/1980 | Durley, III . | |
| 5,118,982 | * | 6/1992 | Inoue | 310/366 |
| 5,828,160 | * | 10/1998 | Sugishita | 310/366 |
| 6,013,972 | | 1/2000 | Face, Jr. et al. . | |
| 6,051,915 | * | 4/2000 | Katsuno | 310/359 |

* cited by examiner

Primary Examiner—Nestor Ramirez
Assistant Examiner—Karen Addison
(74) Attorney, Agent, or Firm—Stephen E. Clark; David J. Bolduc

(57) ABSTRACT

A thickness mode piezoelectric transformer is provided that has masses attached to opposing faces of the transformer. The end-masses increase the thickness of the transformer and decrease its resonant frequency. The end-masses increase the magnitude of resonant vibrations in the output layer(s) as well as the mechanical Q of the device to provide a low profile piezoelectric transformer with high power density. The preferably metal end-masses also act as high voltage output electrodes as well as heat sinks.

12 Claims, 7 Drawing Sheets

THICKNESS MODE PIEZOELECTRIC TRANSFORMER WITH END-MASSES

This application claims priority from provisional application 60/165,864 filed on Nov. 16, 1999.

BACKGROUND OF INVENTION

1. Field of Invention

The present invention relates generally to a voltage converter using layers of piezoelectric ceramic. More specifically, the present invention relates to a multilayer piezoelectric transformer using thickness mode resonant vibration for step-up voltage conversion applications. A metallic mass is bonded to each output ceramic layer thereby providing a piezoelectric transformer operating at a lower frequency, with higher gain and power density than a piezoelectric transformer using simply a thick output ceramic layer.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and thickness of materials of construction of the transformer including the piezoelectric ceramics and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and This type of PT is commonly referred to as a "Rosen-type" piezoelectric transformer. The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode ("d31 mode"). The transverse effect mode vibration in the low impedance vibrator portion 21 in turn excites a vibration in the high impedance generator portion 22 in a longitudinal effect longitudinal vibration mode ("g33 mode"). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

The Rosen type PT has been found disadvantageous in that the only useable coupling coefficient is k31, which is associated with the very small transverse effect longitudinal vibration mode ("d31 mode"). This results in obtaining only a very small bandwidth. Conventional piezoelectric transformers like this operate only up to about 200 kHz.

Another inherent problem of such prior PTs is that they have relatively low power transmission capacity. This disadvantage of prior PTs relates to the fact that little or no mechanical advantage is realized between the vibrator portion 21 of the device and the driver portion 22 of the device, since each is intrinsically a portion of the same electroactive member. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

In addition, with the typical Rosen transformer, it is generally necessary to alternately apply positive and negative voltages across opposing faces of the vibrator portion 21 of the member in order to "push" and "pull", respectively, the member into the desired shape.

Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability.

Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

Also generally known are PTs polarized and vibrating in the thickness direction (i.e., vibrations are parallel to the direction of polarization of the layers). Illustrative of such "thickness mode" vibration PTs is the device of U.S. Pat. No. 5,118,982 to Inoue shown in FIGS. 3 and 4. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers 111 through 114 and a high impedance vibrator portion 12 including a piezoelectric layer 122, each of the layers being integrally laminated, as shown in FIG. 4, and caused to vibrate in thickness-extensional mode.

The low impedance portion 11 has a laminated structure which comprises multi-layered piezoelectric layers 111 through 114 each being interposed between electrodes including the top surface electrode layer 201 and internal electrode layers 131 through 134. The high impedance portion 12 is constructed of the bottom electrode layer 202, an internal electrode layer 134 and a single piezoelectric layer 122 interposed between both electrode layers 202 and 134. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness.

The three-terminal construction of FIG. 3 has a common electrode 134 to which one terminal of each portion is connected. A four-terminal construction as in FIG. 4 includes a pair of terminals 16 and 17 for the low impedance portion 11 and another pair of terminals 18 and 19 for the high impedance portion 12. The total thickness of the PT of FIGS. 3 or is equal to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode ("d33 mode"). This vibration of the low impedance portion 11 excites a vibration in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode or lambda mode the PT may operate in frequency range of 1–10 MHz, depending on the PT's thickness.

A problem with prior thickness mode PTs is that the thickness mode resonant frequency is too high for some applications.

Another problem with prior thickness mode PTs is that they do not have a sufficient power transmission capacity for some applications.

Another problem with prior thickness mode PTs is that the addition of ceramic layers to the PT does not significantly raise the power density of such devices and may increase capacitive and dielectric losses.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable with comparably sized prior piezoelectric transformers.

It would also be desirable to provide a piezoelectric transformer that does not generate as much heat as prior devices, and therefore has decreased loss due to the heat.

It would also be desirable to provide a piezoelectric transformer in which the heat that is generated is dissipated quickly, and therefore has decreased loss due to the heat.

SUMMARY OF THE INVENTION

According to the present invention, there is provided a Thickness Mode Piezoelectric Transformer (TMPT) preferably operating at its natural (i.e. "resonant") frequency to convert a transformer input signal of a first character (i.e. voltage, frequency and current) to a transformer output signal of a second character (i.e. voltage, frequency and current). The disclosed TMPT efficiently accomplishes the described signal conversion by subjecting the input "driver" section of the TMPT to an alternating voltage which causes the input portion to deform and vibrate, which in turn causes the output portion(s) to vibrate, which in turn causes the "driven" output portion of the TMPT to deform, and which in turn generates an output voltage at the driven section of the transformer.

The outermost portions of the output section have end-masses attached to them. These end-masses are added to the output portion of the PT and may replace one or more layers of ceramic in the output portion and thereby serve to increase the momentum of movement of the output portions. The end-masses reduce the resonant frequency of the TMPT and increase the gain of the TMPT by increasing the power density in the output ceramic layers.

The end-masses may be metallic and further serve as output terminals and heat sink devices.

The preferred embodiment of the invention provides a multi-layer piezoelectric transformer capable of achieving high mechanical momentum (and, therefore, is capable of high energy storage and transmission).

Accordingly, it is an object the present invention to provide a TMPT design that has a higher power transmission capacity than similarly sized prior PTs.

It is another object of the present invention to provide a TMPT that is smaller than prior PTs that have similar power transmission capacities.

It is another object of the present invention to provide a TMPT in which the "driver" portion of the device and the "driven" portion of the device are not the same electro-active element.

It is another object of the present invention to provide a TMPT that develops a substantial mechanical advantage between the driver portion of the device and the driven portion of the device.

It is another object of the present invention to provide a TMPT that, at its natural frequency, oscillates with greater momentum than is achievable in comparably sized prior PTs.

It is another object of the present invention to provide a TMPT that is relatively less expensive to manufacture than prior TMPTs that perform comparable signal transformation functions.

It is another object of the present invention to provide a TMPT that vibrates with greater momentum to achieve a higher gain than prior TMPTs.

It is another object of the present invention to provide a TMPT that vibrates with a lower frequency to achieve a higher gain than prior TMPTs.

It is another object of the present invention to provide a TMPT and that is simpler to manufacture than prior TMPTs having a laminate structure.

It is another object of the present invention to provide a TMPT that has fewer losses due to capacitive and dielectric losses.

It is another object of the present invention to provide a TMPT that generates less heat than prior TMPTs, and thereby has reduced losses due to heat.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 1:
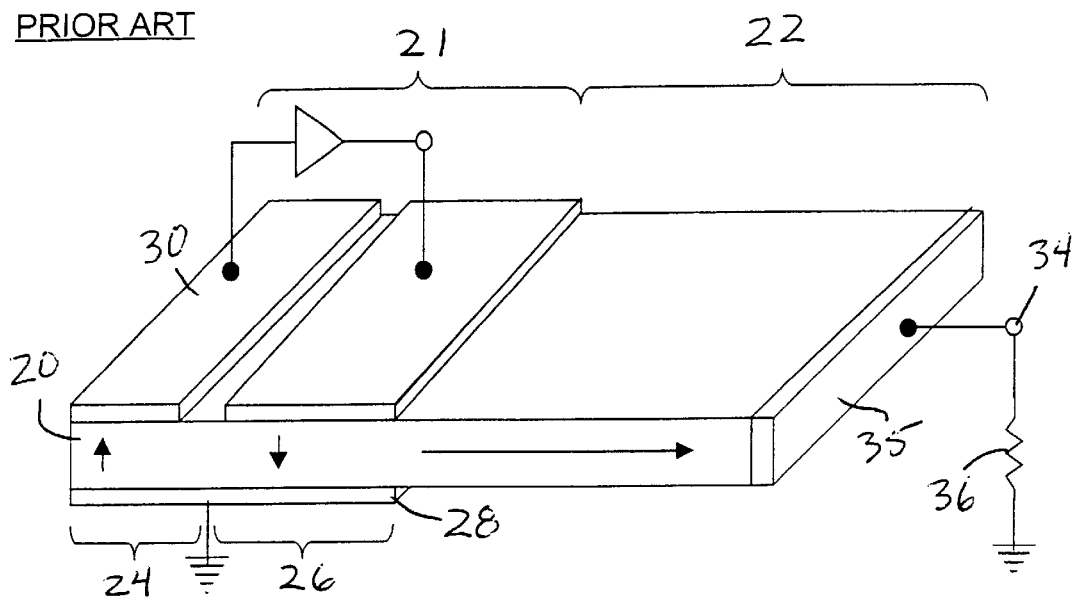
FIG. 1 is a partially schematic perspective view of a typical Rosen type piezoelectric transformer of the prior art.
Figure 2:
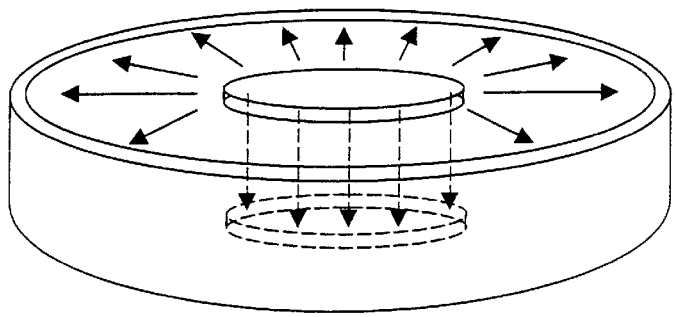
FIG. 2 is a perspective view of another example of a Rosen type piezoelectric transformer of the prior art.
Figure 3:
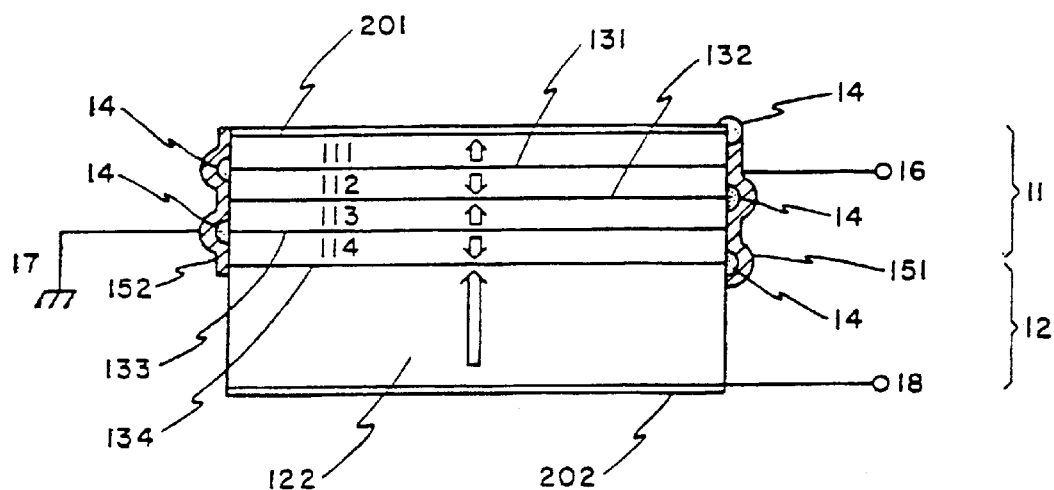
FIG. 3 is a perspective view of a typical multi-layer thickness mode vibration piezoelectric transformer of the prior art.
Figure 4:
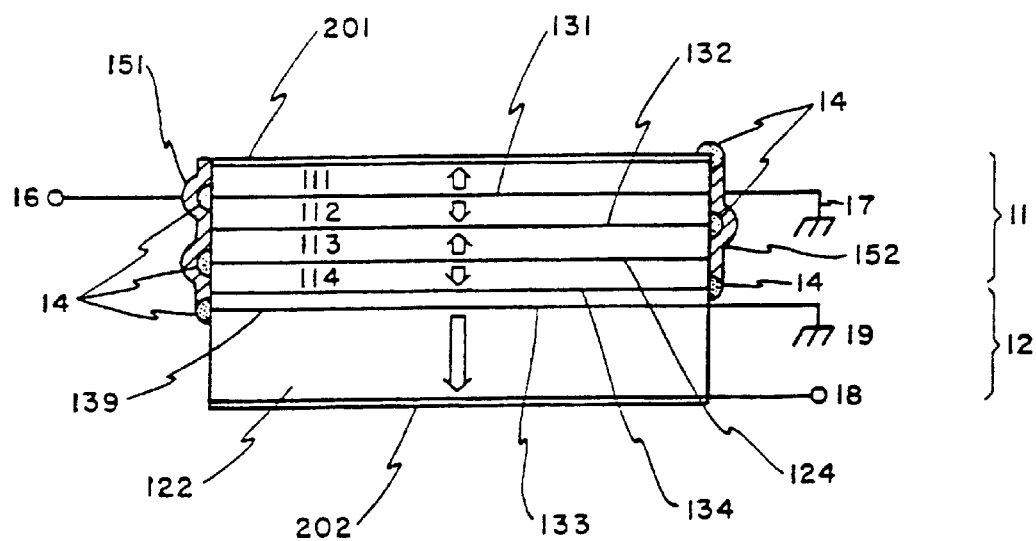
FIG. 4 is a perspective view of another multi-layer thickness mode vibration piezoelectric transformer of the prior art.

In the present invention, a multilayer piezoelectric transformer is provided using thickness mode resonant vibration for step-up voltage conversion applications. An end-mass is bonded to the output ceramic layer. This may be alternatively viewed as replacement of a portion of the output ceramic layer with an end-mass. The end-mass thereby provides a piezoelectric transformer operating at a lower frequency, with higher gain and higher power density than a piezoelectric transformer of the same size using simply a thick output ceramic layer.

Typical thickness mode piezoelectric transformers (TMPTs) utilize a multilayer construction in attempting to provide greater voltage gain and power to circuit applications. The transformation ratio is typically substantially proportional to the square of the impedance ratio of the input and output portions. There is however a practical limit to the efficacy of added ceramic layers and after a certain point, additional ceramic layers do not contribute to the gain of the TMPT. In the present invention it has been found that the addition of endmasses to the output portion(s) of a TMPT may effectively raise the gain achievable in a TMPT.

The output power P of piezoelectric transformer operating in thickness-extensional mode vibration is expressed, based on a simplified consideration from the viewpoint of energy, approximately as:

$$P \alpha f_r \cdot V \cdot \in_{33}^{s} \cdot k_t^2 \cdot P/Q_M$$

where $f_r$ is thickness-extensional mode resonance frequency, $\in_{33}^{s}$ is constraint dielectric constant, V is volume of the piezoelectric transformer, $k_t$ is electromechanical coupling coefficient of thickness-extensional mode vibration, and $Q_M$ is the mechanical quality factor. Thus, in a TMPT the power output per unitary volume (power density) increases with greater electromechanical coupling coefficient $k_t$ and higher resonant frequency $f_r$ of piezoelectric ceramic resonator. By increasing the mechanical quality factor of the piezoelectric transformer, the power transmission efficiency can become higher. Using laminate techniques, prior TMPTs have had poor parallel precision and planeness which resulted in a low mechanical quality factor and lower power transmission efficiency.

In the present invention, a typically metal end-mass is bonded to the output portion of a TMPT. This bonding may be viewed as adding additional mass to the ends of the TMPT or as replacing some or all of the ceramic in an output portion of the TMPT. Adding an end-mass to the output portion of the TMPT increases the total mass and volume of the TMPT. An end-mass may be used to replace a portion of output ceramic and depending on the density of the end-mass that replaces the ceramic, the total volume of the TMPT can remain the same while the mass decreases (with a less dense end-mass) or increases (with the denser endmass). Alternatively, an end-mass may be used to replace a portion of output ceramic and the total mass of the TMPT may remain the same while the volume or length of the TMPT increases (with a less dense end-mass) or decreases (with a denser endmass). These examples are only illustrative of the effect of different density end-masses added to or replacing a part of the output ceramic of the TMPT and it is not necessary for either the mass or volume of the TMPT to remain constant.

In the preferred embodiment of the TMPT a denser end-mass is added to the output portion of the TMPT, increasing both the mass and volume of the TMPT. An increase in the mass of the TMPT as well as a length increase lowers the resonant frequency of the TMPT while increasing the gain and power density. The increase in gain is due to the fact that the added mass increases the momentum of the device without adding any ceramic layers (which add to the capacitance and dielectric losses).

The increase in gain without adding ceramic layers results in a higher power to volume ratio. Furthermore the length of the endmass(es) may be selected to ensure that during operation of the TMPT, maximum compressive and tensile forces are concentrated at the bond line 56 and 58 between the input and output portion(s), resulting in increased gain. Further, since the metallic endmasses have a high mechanical quality factor, the gain and power density increase commensurate with increased mechanical quality factor of the composite TMPT. Furthermore, the cost of the TMPT is reduced due to the availability of inexpensive metal layers to replace the more expensive ceramic layers, and the ease of bonding metal end-masses to ceramic layers as opposed to the expense of conventional laminated multilayer manufacturing techniques.

Figure 5:
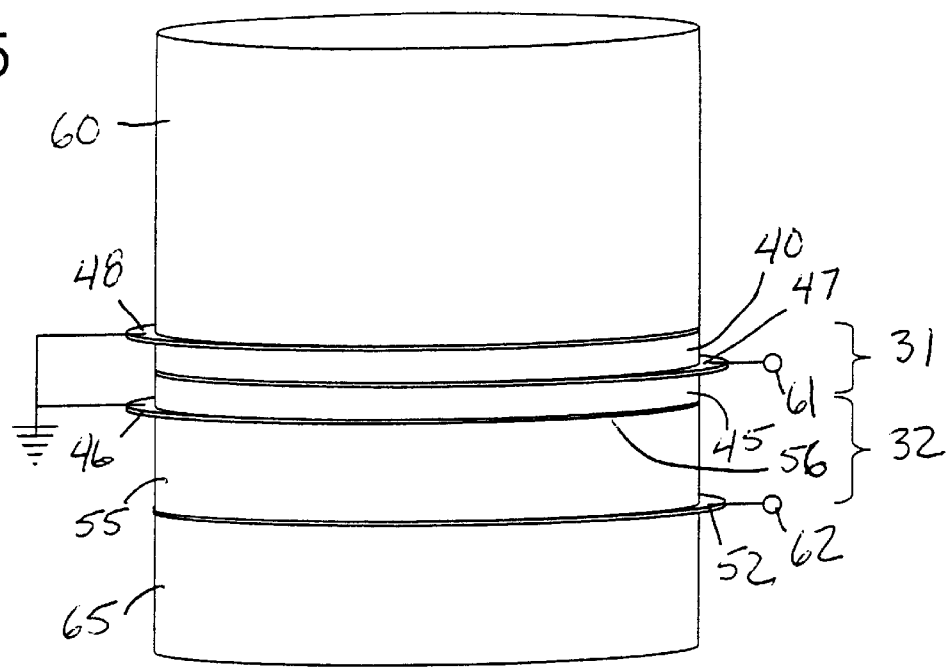
FIG. 5 is a perspective view of one embodiment of a thickness mode vibration piezoelectric transformer of the present invention having a cylindrical configuration.

In the TMPT of FIG. 5, the end-mass tuned TMPT 1 has one input portion 31 and one output portion 32. The input portion 31 of the TMPT 1 comprises two layers 40 and 45 of piezoelectric ceramic separated by an electrode 47. Each of the two input layers 40 and 45 preferably comprises a circular disk of PZT material with electrodes (silver and/or nickel) electrodeposited thereon. The input layers 40 and 45 are polarized in the thickness direction, i.e., in the direction perpendicular to the major faces of the disks. Preferably the direction of polarization of one input layer e.g., 40 is opposite to the direction of polarization of the other input layer e.g., 45.

The two input layers 40 and 45 are each bonded along one of their major faces to a central electrode 47. The central electrode 47 preferably comprises a copper foil. On the remaining major faces of the input layers 40 and 45 are also bonded electrodes 46 and 48, also preferably comprising copper foil. Bonding of the input layers 40 and 45 to the electrodes 46, 47 and 48 is preferably with "Cibageigy AV118" (CIBA) as manufactured by Ciba Specialty Chemicals Corporation, N.A. of East Lansing, Mich.

The output portion 32 of the TMPT 1 comprises a piezoelectric ceramic layer 55. This output layer 55 also preferably comprises a circular disk of PZT ceramic material polarized in the thickness direction. The output layer 55 is of substantially the same circumference as the input layers 40 and 45, but is significantly thicker than the input layers 40 and 45 in the direction of its polarization. One major face of the output layer 55 is bonded to an outboard 46 electrode of the input portion 31, preferably using CIBA adhesive. To the remaining major face of the output layer 55 may be bonded (preferably using CIBA adhesive) another electrode 52, preferably comprising a copper foil.

On each side of the device of FIG. 5 (to the exterior electrodes) is bonded an end-mass 60 and 65 (preferably with CIBA adhesive). The end-masses 60 and 65 are preferably metallic (such as aluminum or steel) and of substantially the same circumference as the input and output layers 40, 45 and 55. Although the end-masses 60 and 65, and the input and output layers 40, 45 and 55 may all be of different circumferences, it is preferred that thy are all of the same circumference. This allows the resonant characteristics to be more uniform and predictable as well as minimizes the profile of the device. The thickness of the end-mass is chosen dependent on the type of material used for the end-mass and the resonant characteristics desired from the composite TMPT. In most cases, the preferred end-mass 60 and 65 will be steel, because it is denser than PZT and the profile of a TMPT 1 may be minimized using a denser endmass 60 and 65. When the material comprising the end-mass 60 and 65 is chosen to be aluminum and the mass of the TMPT 1 is required to remain constant, the thickness of the aluminum cylinder to be bonded to the ceramic layers 40, 45 and 55 is approximately 1.64 times the thickness of the ceramic layer(s) being replaced by the mass. (the ratio of the densities of PZT to aluminum is 82/50 or 1.64).

Figure 6:
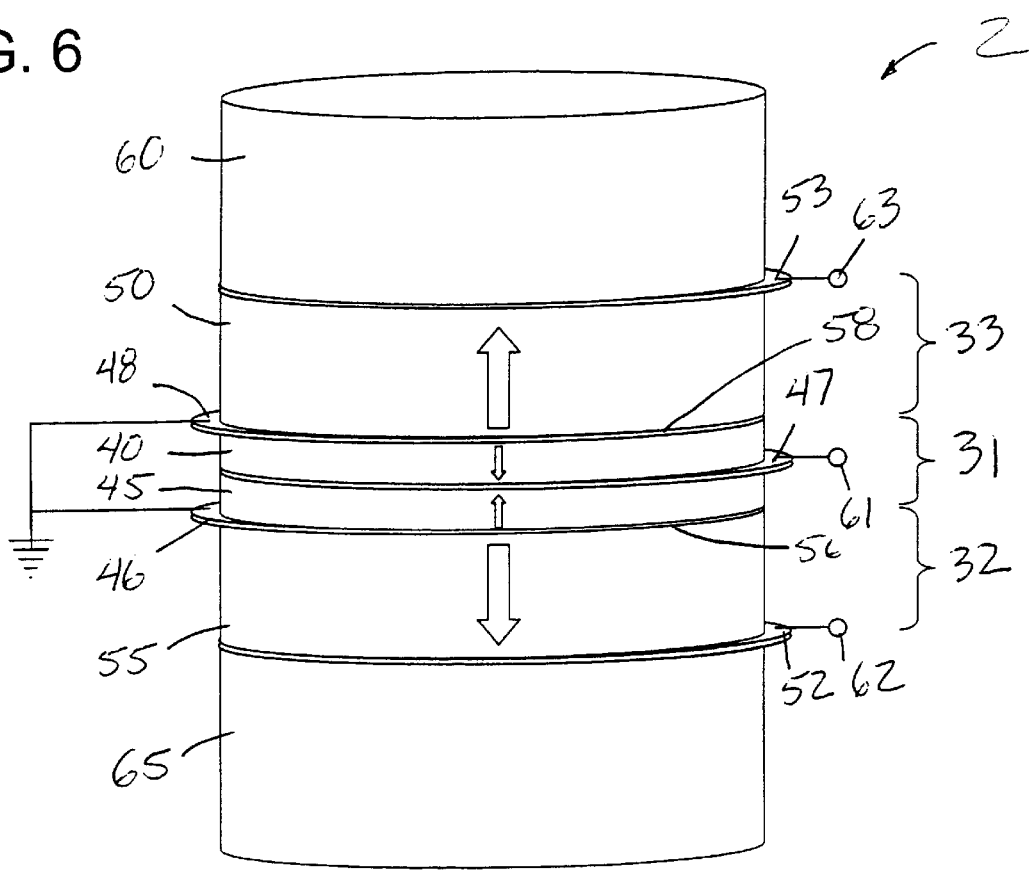
FIG. 6 is a perspective view of another embodiment of a thickness mode piezoelectric transformer of the present invention having a cylindrical configuration.

Now referring to FIG. 6: A TMPT 2 with four ceramic layers may be constructed by bonding a second output portion 33 (preferably with CIBA adhesive) to the input portion 31. The second output portion 33 of the TMPT comprises another piezoelectric ceramic layer 50. This output layer 50 also preferably comprises a circular disk of PZT ceramic material polarized in the thickness direction. The second output layer 50 is of substantially the same circumference as the input layers 40 and 45, but is significantly thicker than the input layers 40 and 45 in the direction of its polarization and is preferably the same thickness as the first output layer 55. Although the end-masses 60 and 65, and the input and output layers 40, 45, 50 and 55 may all be of different circumferences, it is preferred that thy are all of the same circumference. It is also preferred that the input layers 40 and 45 are of substantially equal thickness and that the output layers 50 and 55 are of substantially equal thickness. This allows the resonant characteristics to be more uniform and predictable as well as minimizes the profile of the device. One major face of the second output layer 50 is bonded to the second outboard electrode 48 of the input portion 31, preferably using CIBA adhesive. To the remaining major face of the second output layer 50 may be bonded (preferably using CIBA adhesive) another electrode 53, preferably comprising a copper foil. The direction of polarization of the output layers 50 and 55 is in the thickness direction, and preferably each output layer 50 and 55 is polarized in the direction away from the center electrode 47 of the input portion 31, i.e., the output layers 50 and 55 are preferably polarized in the thickness direction toward their outboard sides.

The end-masses 60 and 65 that are bonded to the output portions 32 and 33 of the TMPT in FIG. 6 are of substantially the same circumference and thickness. When the end-masses 60 and 65 replace a portion of the output ceramic and the mass of the device is required to remain constant and the end-masses 60 and 65 are chosen to be aluminum, the thickness of the first and second end-mounted masses 60 and 65 are each 1.64 times the thickness of the output ceramic disks that each of the end-masses 60 and 65 replaces. When the end-masses 60 and 65 are chosen to comprise another material, such as steel, the ratio will depend on the physical properties (such as the density and dimensions) of the material and what total mass or volume device is desired.

As an example of the dimensions of the TMPT of FIG. 5, the input portion 31 of the device comprises two PZT disks 40 and 45 each with a diameter of 0.75 inches and 0.03 inches thick. The output portion 32 comprises a PZT disk 55 with a diameter of 0.75 inches and a thickness of 0.60 inches. Copper foil 46, 47, 48 and 52 is bonded to each major face of the disks 40, 45 and 55 comprising the input and output portions 31 and 32. To the output portion 32 is bonded an aluminum cylinder 65 with a diameter of 0.75 inches and a thickness of 0.656 inches. To the input portion 31 is bonded an aluminum cylinder 60 with a diameter of 0.75 inches and a thickness of 1.542 inches. With an input voltage of 9.5 $V_{rms}$ a composite TMPT 1 constructed to these specifications achieved voltage gains as high as 112.9.

As an example of the dimensions of the TMPT of FIG. 6, the input portion 31 of the device comprises two PZT disks 40 and 45 each with a diameter of 0.75 inches and 0.03 inches thick. The output portions 32 and 33 each comprise a PZT disk 50 and 55 with a diameter of 0.75 inches and a thickness of 0.60 inches. Copper foil (3 mils) 46, 47, 48, 52 and 53 is bonded to each major face of the disks 40, 45, 50 and 55 comprising the input and output portions 31, 32 and 33. To each of the output portions 32 and 33 is bonded an aluminum cylinder 60 and 65 with a diameter of 0.75 inches and a thickness of 0.656 inches. The dimensions chosen for the TMPTs 1 and 2 of FIGS. 5 and 6 are only illustrative of the possible configurations for an end-masstuned TMPT, and other shapes and thicknesses are both possible and desirable. For example the composite TMPT 1 or 2 need not be cylindrical, and it need not be as thick in height or diameter. It will be understood that since the TMPT is polarized in the thickness direction, that a cross-section (slice) of the cylinder may be taken across its height and the composite TMPT will operate according to the same principles.

Figure 7:
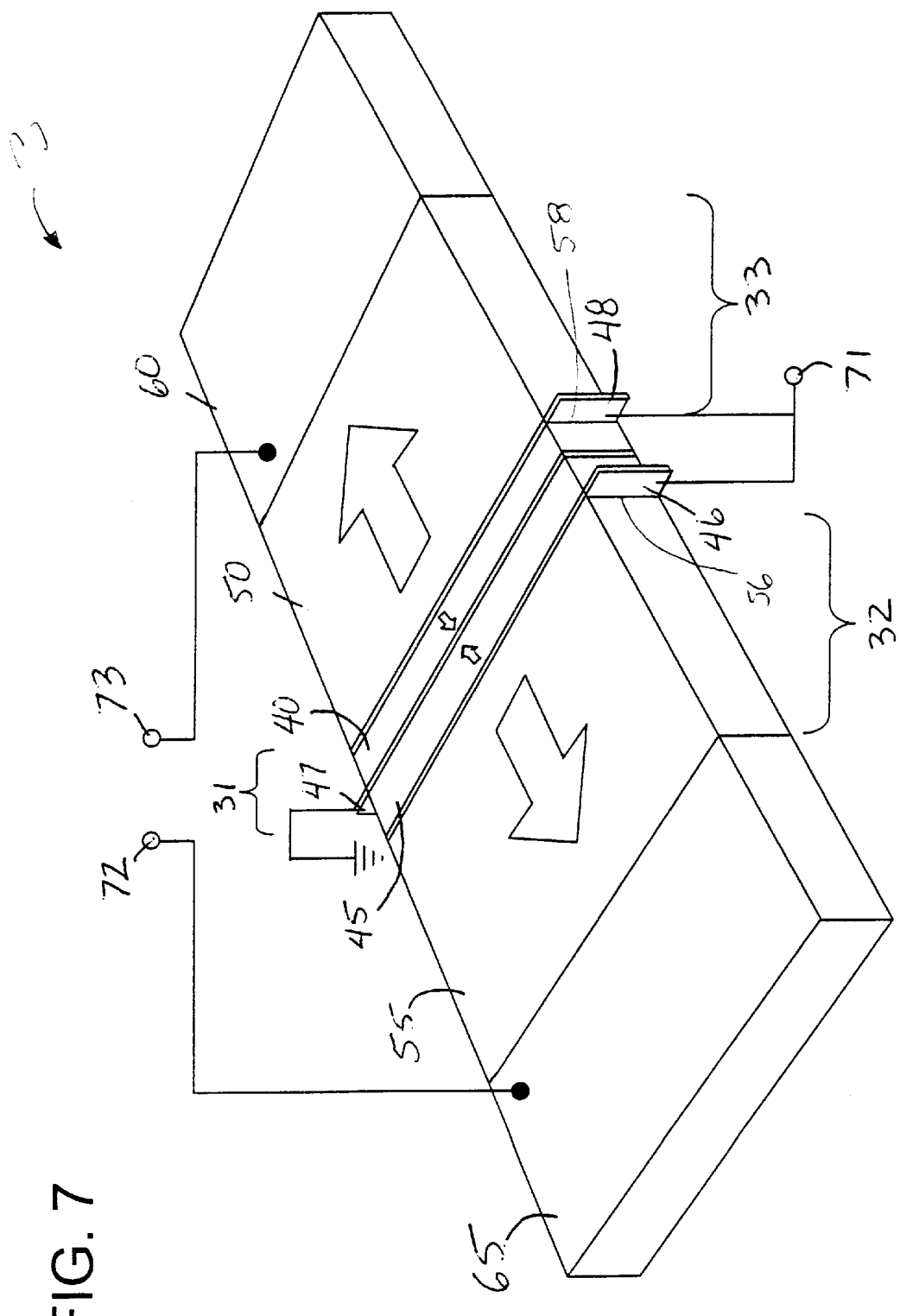
FIG. 7 is a perspective view of the preferred embodiment of a thickness mode piezoelectric transformer of the present invention with a rectangular configuration and showing the preferred electrical connections.

Referring to FIG. 7: A composite TMPT 3 is illustrated which is configured in the shape of a rectangular slab rather than a cylinder. However, (with only slight exceptions) the portions of the TMPT 3 of FIG. 7 remain the same as the TMPT 2 in FIG. 6. In the center of the device is the input portion 31 comprising two layers 40 and 45 of piezoelectric ceramic material (preferably PZT) bonded to a central electrode 47 and two outboard electrodes 46 and 48. To the two outboard electrodes 46 and 48 of the input portion 31 are bonded two output ceramic layers 50 and 55 (preferably PZT). To the outboard sides of the output ceramic layers 50 and 55 are bonded end-masses 60 and 65. In the case of the TMPT 3 of FIG. 7, the end-masses 60 and 65 comprise a conductive material such as steel, and the need for additional electrodes on the outboard sides of the output ceramic layers 50 and 55 is thus obviated.

Figure 8:
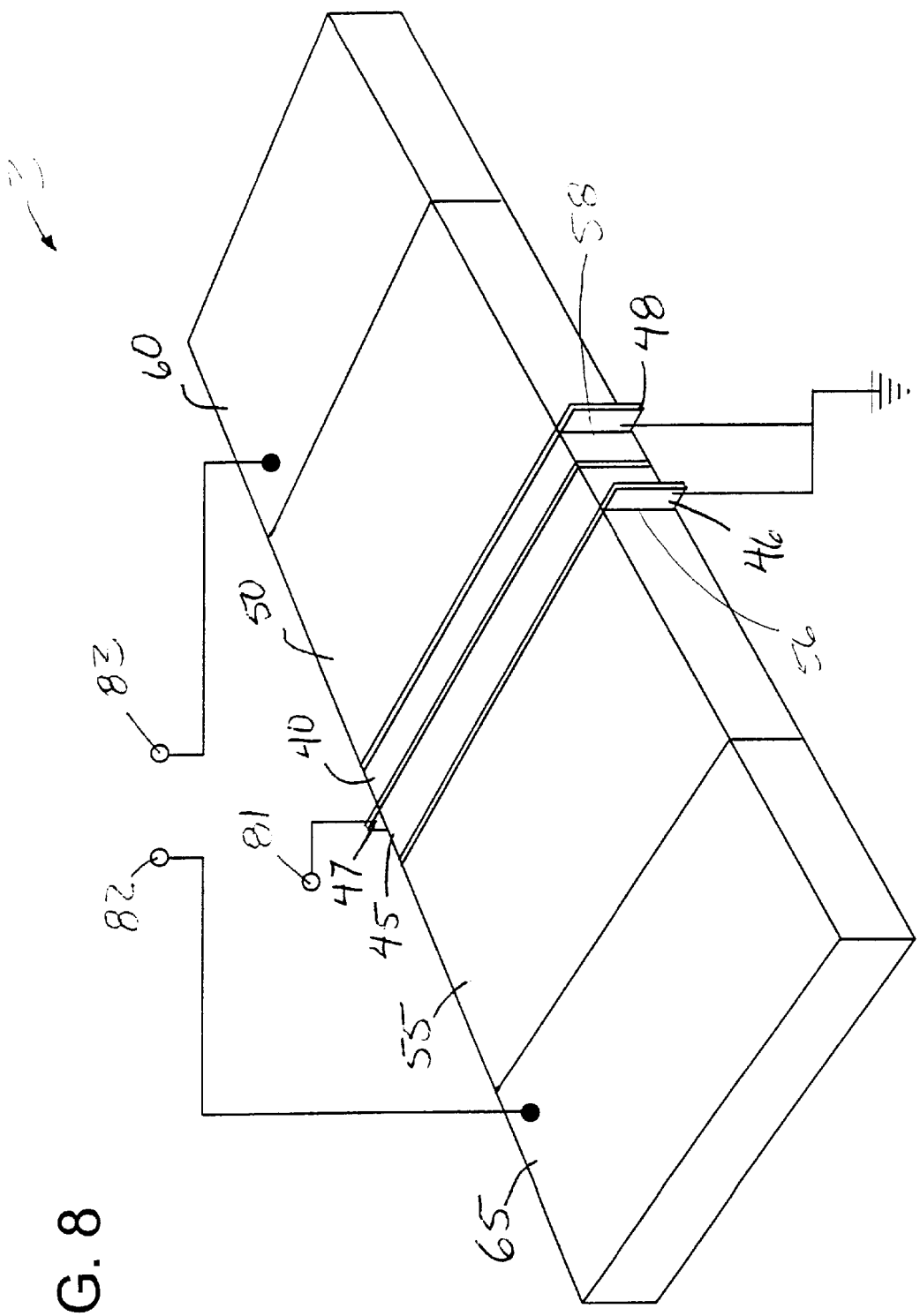
FIG. 8 is a perspective view of the thickness mode piezoelectric transformer of FIG. 7 using a second configuration of electrical connections.
Figure 9:
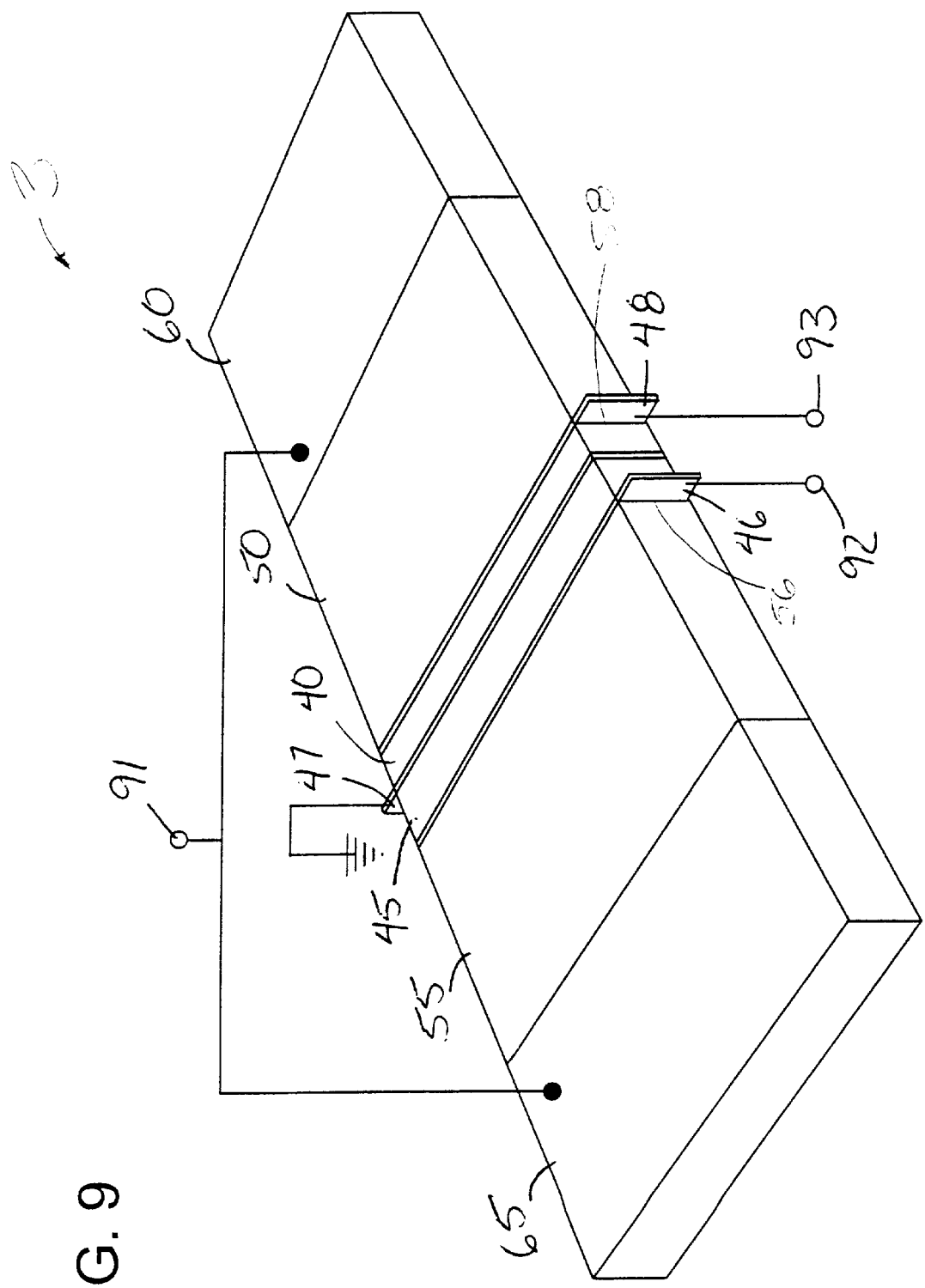
FIG. 9 is a perspective view of the thickness mode piezoelectric transformer of FIG. 7 using an third configuration of electrical connections.

Referring to FIGS. 7, 8 and 9: Each of the TMPTs 3 illustrated in FIGS. 7–9 are constructed identically except for the connection of the input, output and ground terminals. A rectangular slab shaped TMPT 3 was constructed having an input portion 31 comprising two input PZT ceramic layers 40 and 45 that are 0.39 by 0.10 by 0.030 inches thick with a central electrode 47 and outboard electrodes 46 and 48 comprising 3 mil thick copper foil. The output portions 32 and 33 comprises two output PZT ceramic layers 50 and 55 that are 0.39 by 0.10 by 0.40 inches thick bonded to the outboard electrodes 46 and 48 of the input portion 31. The end-masses 60 and 65 comprises layers of steel 0.39 by 0.10 by 0.20 inches thick bonded to the outboard sides of the output portions 50 and 55. These measurements are only illustrative of the dimensions of one embodiment of the invention, and many other embodiments are possible depending on the size, frequency and gain of the desired application.

The ceramic layers 40 and 45 of the input portion 31 are both polarized in the thickness direction and preferably are polarized towards the center electrode 47 as indicated by the arrows. The ceramic layers 50 and 55 of the output portions 32 and 33 are also both polarized in the thickness direction and preferably are polarized away from the center electrode 47 towards the end-mass 60 and 65 on the same side as the respective output portion 32 and 33 as indicated by the arrows.

FIG. 7 depicts the preferred embodiment of the invention in a rectangular slab shaped configuration as well the preferred embodiment of the connection for electrical leads in order to achieve a significant voltage gain. In the preferred embodiment of the invention, the center electrode 47 is a ground connection, and the outboard electrodes 46 and 48 are both connected to input terminal 71. The output voltage from the TMPT is taken across output terminals 72 and 73 connected to electrode/end-masses 65 and 60 respectively. In the embodiment depicted in FIG. 7 and constructed with the dimensions listed hereinabove, the TMPT had a resonant frequency of 53.7 kHz and achieved voltage gains of 19.8.

Referring again to FIG. 7: In operation, a voltage of a first polarity is applied to input terminal 71 connected to outboard electrodes 46 and 48. This voltage causes input ceramic layers 40 and 45 to piezoelectrically contract in the thickness direction (i.e. a d33 mode deformation parallel to the direction of polarization of the layers 46 and 48). When a voltage of an opposite polarity is applied to input terminal 71 connected to outboard electrodes 46 and 48, the applied voltage causes input ceramic layers 40 and 45 to piezoelectrically expand in the thickness direction (i.e. also a d33 mode deformation parallel to the direction of polarization of the layers 46 and 48). Thus, by applying an alternating voltage at a given frequency to the input portion 31 of the TMPT 3, the ceramic layers 40 and 45 cyclically expand and contract (a d33 mode thickness vibration) at the frequency of the applied alternating voltage.

As the ceramic layers 40 and 45 of the input portion 31 of the TMPT 3 expand, the output portions 32 and 33 travel outwardly from the bond lines 56 and 58 along with the securely bonded input portion 31. Conversely, as the ceramic layers 40 and 45 of the input portion 31 of the TMPT 3 contract, the output portions 32 and 33 travel inwardly from the bond lines 56 and 58 along with the securely bonded input portion 31. When the polarity of the voltage applied to the ceramic layers 40 and 45 of the input portion 31 is reversed, the direction of expansion or contraction of the ceramic layers 40 and 45 almost instantaneously reverses. The direction of movement of the output portions 32 and 33 does not change as quickly. Like a mass-spring system, the momentum of the output portions 32 and 33 and end-masses 60 and 65 causes them to continue travelling further in their original direction of movement (thereby causing the ceramic layers 50 and 55 to expand or contract) before changing direction to move in same the direction as the input portion 31. Thus, the movement and changes of direction (vibration) of the input portion 31 causes the output portions 32 and 33 to mechanically strain or deform (due to inertia) in the thickness direction, also vibrating at or near the drive frequency of the voltage applied to the input portion 31. Thus, the d33 mode thickness vibration of the input portion 31 causes a g33 mode thickness vibration in the output portions 32 and 33, and an alternating voltage is piezoelectrically generated across the electrodes 60 and 65 of the output portions 32 and 33.

If the frequency applied to the input portion 31 is chosen to correspond to the natural resonant frequency of the TMPT 3 (in the thickness direction along the length of the TMPT 3), higher deformation in the output of the device and higher gains may be realized. Thus, a TMPT 3 will realize its highest gains operating at resonance. The resonant frequency of the TMPT depends not only on the length of the device (relative to the wavelength of the applied frequency), but also the mass of the device, including the end-masses 60 and 65. The resonant frequency also varies with the length and mass of each individual output layer 50 or 55 and its ratio of length and mass to its respective end-mass 60 or 65. Bonding the end-masses 60 and 65 to the output portions of the TMPT 3 increases the length and the mass of the TMPT 3 and therefore lowers the resonant frequency of the device. The length and mass of the end-masses 60 and 65 can also be chosen to increase the momentum of the output portions 32 and 33 while concentrating the compressive and tensile forces about the bond-lines 56 and 58 between the input portion 31 and output portions 32 and 33. Increasing these compressive and tensile forces also increases the gain realized in the TMPT 3. The increased mass and momentum of the TMPT 3 is accomplished by adding the end-masses 60 and 65 that are denser than the output ceramic and not by adding additional ceramic layers to the device. By eliminating the need for additional output ceramic layers, capacitive and dielectric losses are reduced, and the achievable gain of the device increases. The end-masses 60 and 65 further reduce dissipative losses by allowing the TMPT 3 to operate at a lower frequency which reduces the heat generated by the device (heat which can increase dielectric losses). Furthermore, because the end-masses 60 and 65 are typically chosen to be metallic, the end-masses 60 and 65 act as heat sinks which absorb and dissipate the heat generated in the ceramic layers 50 and 55, and further reduce dielectric losses due to heat.

Figure 10:
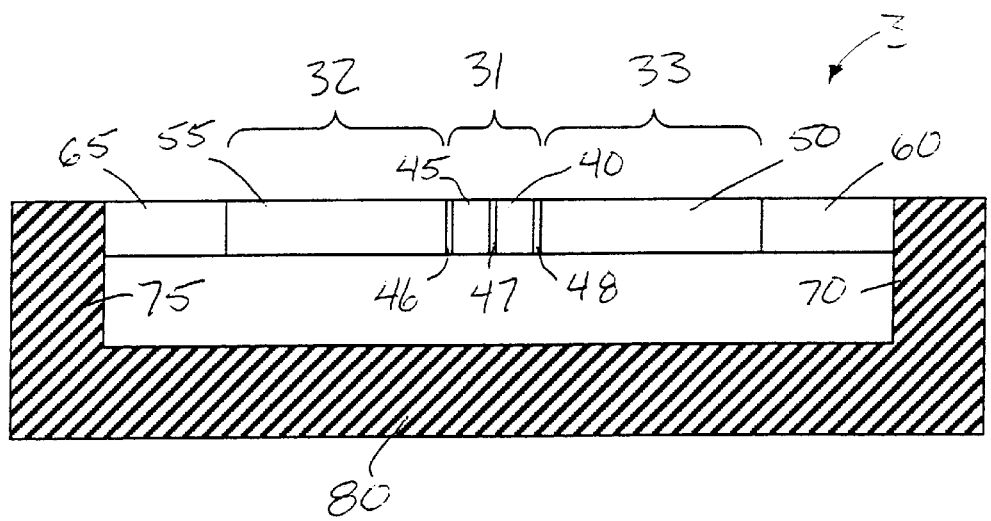
FIG. 10 is an elevation view showing a modified longitudinally prestressed thickness mode piezoelectric transformer within a housing member.

Referring to FIG. 10: The TMPT may further be modified and increased gain can be achieved by subjecting the TMPT to a compressive stress. Applying a compressive force to the ceramic layers 40, 45, 50 and 55 of the TMPT extends the mechanical limits of deformation for the composite device. As illustrated in FIG. 10, the TMPT of FIG. 7 may be placed in a mounting device 80 that contacts and presses inwardly against the end-masses 60 and 65 of the TMPT. As the TMPT contracts and expands, the walls 70 and 75 of the mounting device 80 maintain a compressive force against the ends 60 and 65 of the TMPT 3. By maintaining a compressive force on the TMPT 3, the tensile forces acting upon it are reduced. Since a TMPT 3 not under compression is most likely to fail in tension, the application of a compressive force, which reduces the tensile force, allows the TMPT 3 to operate at higher stresses without being strained to the point of mechanical failure. Because the mechanical limits of performance of the prestressed TMPT 3 are higher, the TMPT 3 can operate under compression at higher voltages and greater stresses, thereby providing increased gain.

The TMPTs illustrated in FIGS. 5–10 also provide greater power density, and therefore greater power transmission efficiency than prior devices. In the present invention, the end-masses 60 and 65 (typically metal having a high mechanical quality factor (Q)) are bonded to the output portions 50 and 55 of a TMPT to augment or replace some or all of the ceramic in the output portions 32 and 33. By increasing the mechanical quality factor of the composite piezoelectric transformer, the gain and power transmission efficiency can become higher. The increase in gain is due to the fact that the additional mass increases the momentum of the device without adding ceramic layers (which would add to capacitance and dielectric losses). The increase in gain using less ceramic layers results in a higher power to volume ratio. Also, since the end-masses augment replace a some or all of an output ceramic layer, and the metallic end-masses have a higher mechanical quality factor than the ceramic they augment or replace, a higher gain is realized with less ceramic, and the power density of the composite TMPT increases. Furthermore, when the end-masses are chosen to be a material (like steel) that is denser than the ceramic, a TMPT of a given size may be constructed that has greater mass (than its all ceramic counterpart) and therefore a lower resonant frequency of operation. The greater mass for a given size TMPT also provides greater momentum and therefore generates higher voltage gains as well as increased power handling capacity.

While the above description contains many specificities, these should not be construed as limitations on the scope of the invention, but rather as an exemplification of one preferred embodiment thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

While the input portion preferably comprises two relatively thin layers of ceramic, the input portion may comprise as few as one ceramic layer or may be of a multi-layer construction;

The shape of the TMPT need not be cylindrical or slab shaped, and many other shapes or configurations are possible;

The direction of polarization of the input layers need not be toward the central electrode, but may be away from the central electrode or both layers may be polarized in the same direction;

The direction of polarization of the output layers need not be away from the central electrode, but may be toward the central electrode or both layers may be polarized in the same direction;

The material of construction of the end-masses need not be aluminum or steel, but may be a different metal, or even a non-metallic material;

Accordingly, the scope of the invention should be determined not by the embodiment illustrated, but by the appended claims and their legal equivalents.

I claim:

1. A piezoelectric transformer, comprising:
   a first input ceramic layer having first and second opposing major faces and polarized in a direction parallel to an axis normal to said first and second opposing major faces;
   a first output ceramic layer having first and second opposing faces and polarized in a direction parallel to said axis;
   a first input electrode adjacent said first major face of said first input ceramic layer and said first face of said first output ceramic layer;
   a first rigid mass adjacent said second face of said first output ceramic layer;
   a second rigid mass; and
   a second input electrode between said second major face of said first input ceramic layer and said second rigid mass;
   wherein upon application of a first oscillating voltage across said first and second input electrodes, said first input ceramic layer alternatingly expands and contracts in said direction parallel to said axis; and
   wherein upon said expansion and contraction of said first input ceramic layer in said direction parallel to said axis, said first and second rigid masses move parallel to said axis; and
   wherein said expansion and contraction of said first input ceramic layer in combination with said movement of said first and second rigid masses in said direction parallel to said axis causes a first oscillating mechanical strain of said first output ceramic layer parallel to said axis; and
   wherein said first oscillating mechanical strain of said first output ceramic layer piezoelectrically generates a second oscillating voltage between said first and second faces of said first output ceramic layer.

2. The piezoelectric transformer of claim 1, further comprising:
   a third input electrode between said second rigid mass and said second input electrode; and
   a second input ceramic layer having first and second opposing major faces and polarized in a direction parallel to said axis;
   said first major face of said second input ceramic layer being adjacent said third input electrode and said second major face of said second input ceramic layer being adjacent said second input electrode.

3. The piezoelectric transformer of claim 2, further comprising:
   a second output ceramic layer having first and second opposing faces and polarized in a direction parallel to said axis;
   said first face of said second output ceramic layer being adjacent said third input electrode and said second face of said second output ceramic layer being adjacent said second rigid mass;
   wherein upon application of said first oscillating voltage across said second and third input electrodes, said second input ceramic layer alternatingly expands and contracts in said direction parallel to said axis;
   and wherein upon said expansion and contraction of said second input ceramic layer in said direction parallel to said axis, said first and second rigid masses move parallel to said axis;
   and wherein said expansion and contraction of said second input ceramic layer in combination with said movement of said first and second rigid masses in said direction parallel to said axis causes a second oscillating mechanical strain of said second output ceramic layer parallel to said axis;
   and wherein said second oscillating mechanical strain of said second output ceramic layer piezoelectrically generates a third oscillating voltage between said first and second faces of said second output ceramic layer.

4. The piezoelectric transformer of claim 3, wherein said first rigid mass comprises an electrically conductive material in contact with said second face of said first output ceramic layer;
   and second rigid mass comprises an electrically conductive material in contact with said second face of said second output ceramic layer.

5. The piezoelectric transformer of claim 3, wherein said first and second input ceramic layers and said first and second output ceramic layers are of substantially the same cross section.

6. The piezoelectric transformer of claim 3, wherein said first input electrode further comprises a first bondline between said first face of first input ceramic layer and said first face of first output ceramic layer;
   and wherein said mechanical strain in said first output ceramic layer is concentrated at said first bondline.

7. The piezoelectric transformer of claim 6, wherein said third input electrode further comprises a second bondline between said first face of second input ceramic layer and said first face of second output ceramic layer;
   and wherein said mechanical strain in said second output ceramic layer is concentrated at said second bondline.

8. The piezoelectric transformer of claim 7, further comprising:
   means for applying an oscillating voltage of a first frequency across said first or second input ceramic layers.

9. The piezoelectric transformer of claim 8, wherein said first frequency is equal to a resonant frequency of oscillation parallel to said axis.

10. The piezoelectric transformer of claim 9, further comprising:
    mounting means comprising a base and first and second walls extending from said base;
    said first wall exerting a pressure against said first rigid mass along said axis;
    said second wall exerting a pressure against said second rigid mass along said axis.

11. The piezoelectric transformer of claim 2, wherein said first input ceramic layer and said second input ceramic layer are polarized in opposite directions parallel to said axis.

12. The piezoelectric transformer of claim 3, wherein said first output ceramic layer and said second output ceramic layer are polarized in opposite directions parallel to said axis.

* * * * *